United States Patent
Smith

(10) Patent No.: US 7,500,162 B2
(45) Date of Patent: Mar. 3, 2009

(54) SOURCING INTERNAL SIGNALS TO OUTPUT PINS OF AN INTEGRATED CIRCUIT THROUGH SEQUENTIAL MULTIPLEXING

(75) Inventor: Alan G. Smith, Livermore, CA (US)

(73) Assignee: CPU Technology, Inc., Pleasanton, CA (US)

( * ) Notice: Subject to any disclaimer, the term of this patent is extended or adjusted under 35 U.S.C. 154(b) by 53 days.

(21) Appl. No.: 10/908,958

(22) Filed: Jun. 2, 2005

(65) Prior Publication Data

US 2007/0022345 A1  Jan. 25, 2007

(51) Int. Cl.
*G01R 31/28* (2006.01)

(52) U.S. Cl. .................. 714/725; 714/25; 714/726; 714/727; 714/732; 714/734; 714/736; 714/742; 702/120; 716/4; 716/16; 716/17; 375/224; 326/38; 326/39

(58) Field of Classification Search .................. None
See application file for complete search history.

(56) References Cited

U.S. PATENT DOCUMENTS

| | | | | |
|---|---|---|---|---|
| 5,051,996 A | * | 9/1991 | Bergeson et al. ............ 714/732 |
| 5,465,257 A | * | 11/1995 | Yamahata et al. ............ 714/733 |
| 6,208,162 B1 | * | 3/2001 | Bocchino ..................... 326/38 |
| 6,252,805 B1 | * | 6/2001 | So et al. ................. 365/189.07 |
| 6,314,550 B1 | * | 11/2001 | Wang et al. .................... 716/17 |
| 6,499,123 B1 | * | 12/2002 | McFarland et al. .......... 714/724 |
| 6,523,136 B1 | * | 2/2003 | Higashida .................... 714/30 |
| 6,625,768 B1 | * | 9/2003 | Reohr et al. ................ 714/729 |
| 6,738,929 B2 | * | 5/2004 | Swoboda et al. ............. 714/28 |
| 7,010,722 B2 | * | 3/2006 | Jahnke ........................ 714/30 |
| 7,114,135 B1 | * | 9/2006 | Gauvin .......................... 716/4 |
| 2005/0289418 A1 | * | 12/2005 | Agarwal ..................... 714/726 |

* cited by examiner

*Primary Examiner*—John P Trimmings
(74) *Attorney, Agent, or Firm*—Aka Chan LLP

(57) ABSTRACT

An integrated circuit with a multiplexer system and a control circuit is described. The multiplexer system has an output terminal connected to an output pin of the integrated circuit and input terminals connected to internal nodes of the integrated circuit. In a normal mode the control circuit generates the control signals so that any one of the internal nodes is connected to the output pin so that the integrated circuit can function flexibly. In a test mode so that a different internal node is connected to the output pin in each cycle of a test clock signal.

23 Claims, 3 Drawing Sheets

SOURCING INTERNAL SIGNALS TO OUTPUT PINS OF AN INTEGRATED CIRCUIT THROUGH SEQUENTIAL MULTIPLEXING

BACKGROUND OF THE INVENTION

The present invention is related to the testing of integrated circuits and, more particularly, to the testing of integrated circuits with minimum intrusion to integrated circuit designs and minimal impact on times to perform test procedures on the integrated circuits.

Since the first integrated circuit in the late 1950's, the number of transistors and wiring interconnects on a single chip has increased dramatically. Today, hundreds of millions of transistors and wiring interconnections may be found in one integrated circuit. With this increased complexity has come problems in testing the functional integrity of integrated circuits.

There are many approaches to integrated circuit testing. One approach is the use of test equipment, such as a chip tester, which initiates a sequence of digital events on the input pins of the integrated circuit and on a triggering event records the signals on the output pins of the integrated circuit for external analysis by the logic analyzer. However, this traditional approach requires the integrated circuit to be operational and signals to travel through the integrated circuit's input/output blocks to the external world. The internal workings of the integrated circuit is tested only through the device's input/output interfaces. Another approach is to build test circuits in the integrated circuit itself in order to directly test selected internal nodes of the integrated circuit. For such testing, the integrated circuit is generally operated in a test mode. For example, using test methodologies, such as IEEE 1449.1 (commonly referred to as JTAG), test vectors are scanned into the integrated circuit to set the states of internal nodes and then the test results are retrieved from the integrated circuit.

Whatever approach is taken to test the integrated circuit, it is desirable that not only the testing be effective, but that the amount of circuit resources and time dedicated to testing be minimized. If test circuits are built on the integrated circuit, they should not consume too much space on the substrate. Preferably, as much as possible of the substrate should be dedicated to original purpose of the integrated circuit. Furthermore, the added test circuits should avoid or minimize any increase in the time for testing the integrated circuits.

The present invention provides for such testing in an integrated circuit, particularly certain integrated circuits with multiple sources for output pins.

SUMMARY OF THE INVENTION

The present invention provides for an integrated circuit which has a multiplexer system and a control circuit. The multiplexer system has at least one output terminal connected to at least one output pin of the integrated circuit and a plurality of input terminals connected to a plurality of internal nodes of the integrated circuit. The multiplexer system selectively connects one of the plurality of internal nodes to the output pin responsive to control signals from the control circuit. In a normal mode the control circuit generates the control signals so that one of the plurality of internal nodes is connected to the output pin. In a test mode the control circuit generates the control signals so that a different internal node is sequentially connected to the output pin responsive to a test clock signal. The multiplexer system may be organized as one or more interconnected multiplexers. The multiplexer system may have a plurality of output terminals connected to a plurality of output pins. The multiplexer system selectively connects a subset of the plurality of internal nodes to the plurality of output pins responsive to the control signals, and the control circuit generates the control signals to the multiplexer system so that different subsets of internal nodes are sequentially connected to the plurality of output pins responsive to the test clock signal.

The present invention also provides for a method of operating an integrated circuit which has the steps of selectively connecting at least one of a plurality of internal nodes of the integrated circuit to at least one output pin of the integrated circuit through a multiplexer system in a normal mode; and sequentially connecting a different at least one of the plurality of internal nodes of the integrated circuit to the at least one output pin through the multiplexer system responsive to a test clock signal in a test mode. With a plurality of output pins of the integrated circuit, the method provides for selectively connecting a subset of the plurality of internal nodes to the plurality of output pins in the normal mode, and sequentially connecting different subsets of the plurality of internal nodes the plurality of output pins responsive to the test clock signal in the test mode.

DESCRIPTION OF SPECIFIC EMBODIMENTS

One trend in the evolution of integrated circuits has been toward devices with flexible functionality, i.e., integrated circuits which can be modified to varying degrees to adapt to different applications. Initially, the function of an integrated circuit was fixed with its design. The designer of an electronic system selected a particular chip to fit into the system. If a system designer was not satisfied by the available choice of integrated circuits, he or she could order or design a custom chip at a much higher cost per chip.

Recognizing this need, integrated circuit manufacturers introduced integrated circuits which could be programmed to varying degrees. Early PLDs (Programmable Logic Devices), such as PLAs and PALs, allowed the integrated circuit user to program different fairly simple sets of logic functions into the integrated circuits. Other flexible integrated circuits included gate arrays, which were partially manufactured integrated circuits. Once a customer specified the interconnections for an application, the manufacturer could quickly complete the integrated circuit for delivery.

Current flexible integrated circuits include FPGAs (Field Programmable Gate Arrays), which have an array of programmable function logic blocks and interconnections. The FPGA user configures the logic blocks and their connections for the particular application. Also, ASICs (Application Specific Integrated Circuits) allow the user to select and assemble highly complex functional blocks, such as processor units, in an integrated circuit for user's application.

An example of a current application of such flexible integrated circuits is the cellular telephone. Cellular telephone networks currently operate under several standards, e.g.,. CDMA, WCDMA, GSM, 3G and variants of these standards, and it is beneficial for the cell telephones to be able to operate under different standards. This allows the telephone user to conveniently move from location to location without changing telephones.

To operate under different standards, integrated circuits (such as ASICs) in the cellular telephone handsets might be able to programmably rewire their circuit blocks to modify their functions for the local standard. Alternatively, rather than changing the function of the circuit blocks, the integrated circuit might have a plurality of circuit blocks, each of which operating under a different standard. Programming selects the particular circuit blocks for operation under the local standard. In both cases but particularly with the second, the ability to change the signal source of one or more output pins may be highly beneficial to the integrated circuit for functional flexibility.

Figure 1:
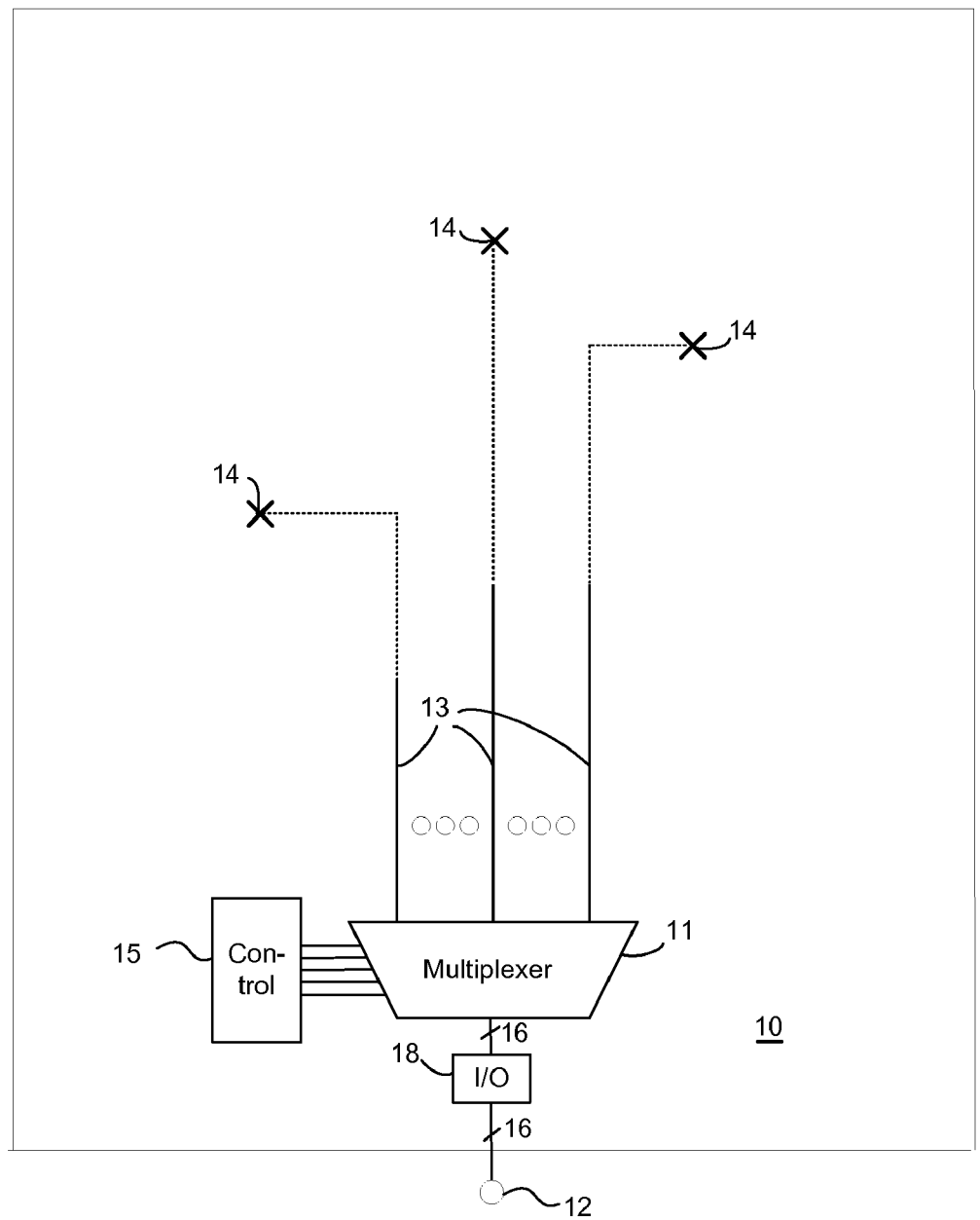
FIG. 1 is representational view of circuitry which can selectively change the internal signal source to an output pin of an integrated circuit.

FIG. 1 illustrates such an exemplary arrangement in an integrated circuit 10 which has a multiplexer 11 having its output terminal connected to an output pin 12. For purposes of clarity, other parts of the integrated circuit, such as those contributing to the function of the device, are not shown. Multiple input terminals of the multiplexer 11 are connected by interconnection traces 13 to various internal circuit nodes 14 in the integrated circuit 10. While the interconnection traces 13 of only three input terminals are illustrated, it should be understood that many more input terminals and internal circuit nodes 14 are possible. A control circuit 15 responsive to software control selects which node 14 should be connected to the output pin 12 through an input/output buffer 18. The software and the control circuit 15 may be part of a system which also programs other parts of the integrated circuit to define its functionality, as described above.

While only one multiplexer 11 with one output pin 12 and interconnection traces 13 for internal nodes 14 is described, it should be understood that a plurality of such multiplexers with output pins, interconnection traces for other internal nodes may be used in the integrated circuit 10. In normal mode such multiplexers might operate so that related internal nodes are simultaneously connected to output pins. For example, such related internal nodes might be the latches of registers in different parts of the integrated circuit. Or, the related internal nodes might be the parallel paths of a bus, or the like. Alternatively, the internal nodes of the plurality of multiplexers might not be closely related. FIG. 1 representationally shows a plurality (16, in this example) of input lines connected to the input/output buffers 18 and the output pins 12.

Figure 2:
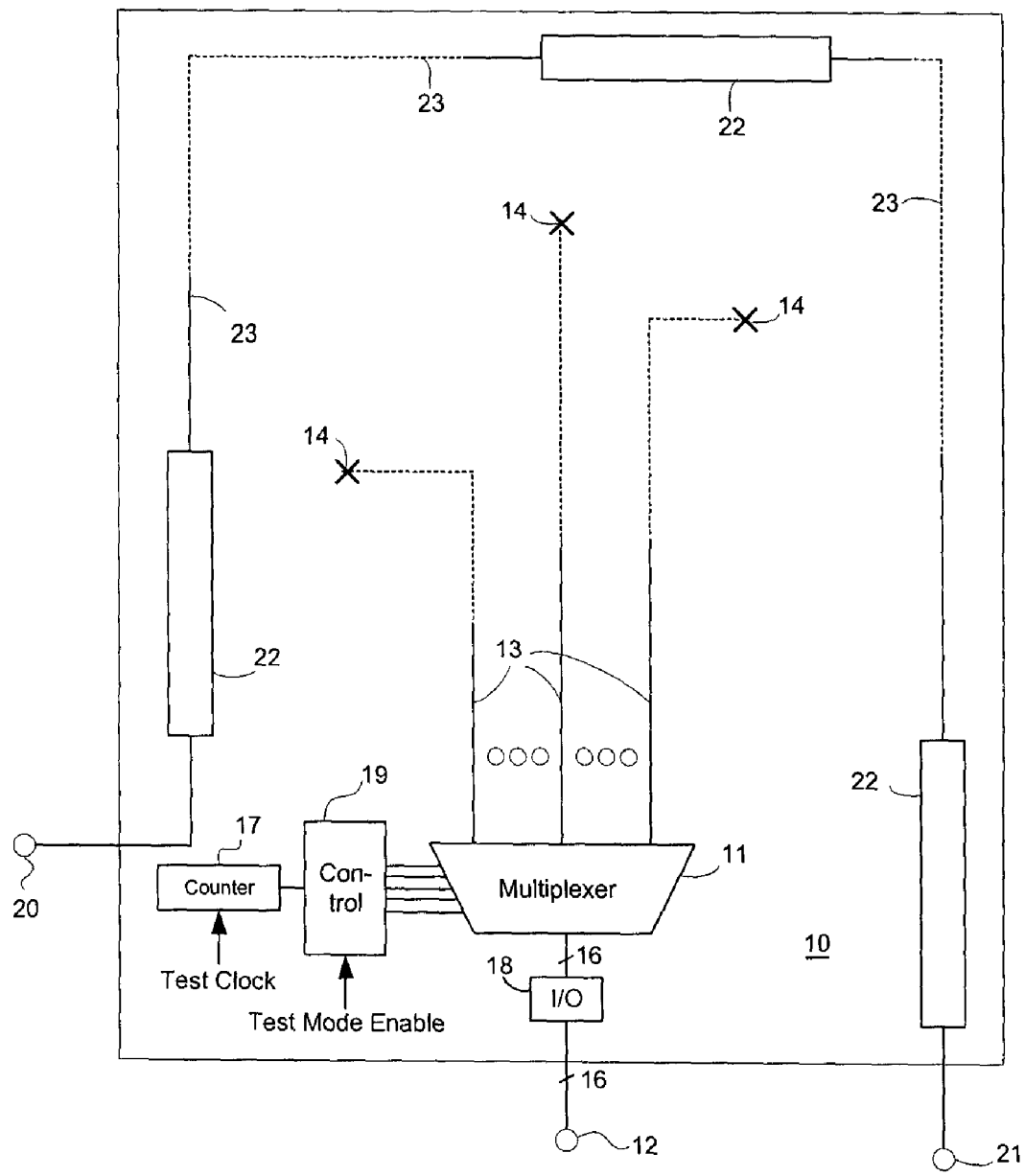
FIG. 2 illustrates a modification of the FIG. 1 circuitry which allows testing of internal nodes of the integrated circuit, according to an embodiment of the present invention.

Such a circuit arrangement permits testing of the integrated circuit with a minimum investment of resources in hardware and time, according to the present invention. FIG. 2 is an example by which the circuit arrangement of FIG. 1 is modified for testing according to the present invention. Again, only one multiplexer 11 is shown for clarity's sake, but is in fact representative of a plurality (16, in this example) of output pins, multiplexers, and interconnection traces. The same reference numerals are used where the substantially the same element performs the same function. The control logic 19 is modified from the FIG. 1 control logic 15. Upon receipt of a Test Mode Enable signal, the control logic 19 becomes unresponsive to its normal operation input signals and accepts the signals from a counter 17. The control logic 19 allows the multiplexer 11 to step through its inputs at each clock cycle in a test mode, as compared to the operations, or normal, mode described above. In normal operation, the counter 17 is effectively inoperative and the control logic 19 operates as described previously.

In a test mode, the counter 17 responsive to a test clock, increments on each test clock cycle and engages the control logic 19 so that a different interconnection trace 13 is connected to the output pin 12 through the buffer 18 in each test clock cycle. After N test clock cycles where N is the number of internal nodes 14, the first interconnection trace 13 (and its internal node 14) which began the N test clock cycles is once again connected to the output pin 12. The internal nodes 14 to which the input traces of the multiplexer are connected are used as test node locations. The states of the internal nodes 14 are retrieved through the output pin 12 where the state of the pin is observed by external test circuitry where the state of the pin is compared to an expected value. A difference between actual and expected values indicates a failure of the integrated circuit. In this fashion, a pseudo-random sampling of the internal state of the device is checked to verify that it is correct.

Test vectors containing expected values can be created by performing a simulation of the integrated circuit 10 and capturing the state of each output pin 12 at each test clock cycle. For subsequent virtual simulations , a comparison can be made between the previously captured vectors and the state of the pins of the simulation. Similarly, the captured test vectors can be applied to a physical chip test machine in order to test the actual physical integrated circuit 10.

This test arrangement can be combined with conventional test procedures. In the exemplary circuit arrangement of FIG. 2, the integrated circuit 10 also has a conventional serial scan circuit of a data input terminal 20, a data output terminal 21, and intervening serial registers 22 and interconnections 23. Test vectors are scanned in through the input terminal 20 and the test results are scanned out through the output terminal 21. The bit locations of the serial registers 22 are used to set (with the test vectors) and capture states (the test results) at selected internal nodes of the integrated circuit 10. Not shown are the other serial scan input terminals, such as test clock and test mode input terminals which are used in JTAG, for example.

With the present invention, the internal nodes 14 can also be tested coincidentally with other test procedures for the integrated circuit. In this example, the test procedure is performed by serial scanning. That is, while serial scan tests are being performed, the control logic 19 operates the multiplexer 11 in response to this test mode to connect different input traces 13 and their respective internal nodes 14 to the output pin 12 at each test clock cycle, as explained previously. No time is lost since the conventional serial scan tests are performed while the internal nodes 14 are also being tested according to the present invention. That is, even with the additional of the pseudo-random testing of the present invention, valuable testing time is minimized.

Figure 3:
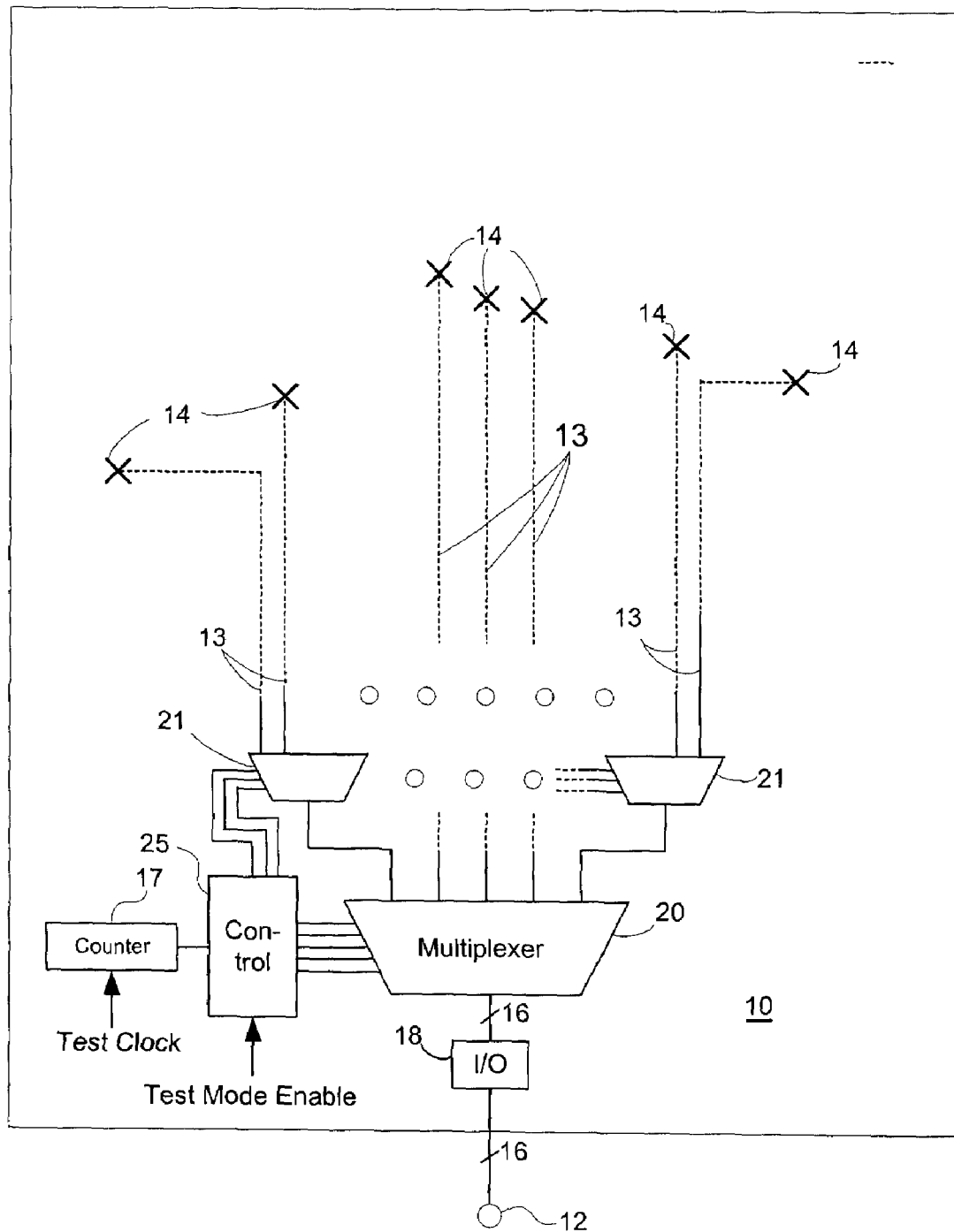
FIG. 3 shows an exemplary multi-multiplexer system; according to an embodiment of the present invention.

Furthermore, a system of interconnected multiplexers can be used in place of a single multiplexer as shown in FIGS. 1 and 2. Such interconnected multiplexers are useful where the number of input nodes which might be connected to an output pin is large. FIG. 3 shows an exemplary two-level multiplexer system which has a single multiplexer 20 connected to an output pin 12 through an input/output block 18. The input terminals of the multiplexer 20 are connected to the output terminals of a plurality of parallel-connected multiplexers 21. The input terminals of these multiplexers 21 are connected to the interconnection traces 13 and their internal nodes 14. A control logic block 25, which is connected to a counter 17, sets the operations of the multiplexer 20 and 21 in normal and test modes.

An example of a two-level multiplexer system implemented in an ASIC, in this case, an embedded multiprocessor system, which has several independent microprocessors, each running a different software program, together with multiple memory subsystems, input/output interfaces, and inter-processor communication channels, is described in the following HDL (Hardware Description Language):

```
// trace select auto-count
   ercounter(incTRACKT, 1dTRCTRb, TRRESETb, TRSEL
[15:13], TRACESEL[15:13]);
   ercounter(enTRAutoCount,  1dTRCTRb,  RESETb,
TRSEL[8:0], TRACESEL[8:0]);
   incTRCKT=enTRAutoCount & (TRACESEL[8:0]==0×
1FF
   !TRRESETb=!RESETb # incTRCKTHI & (TRACESEL
[15:13]==4);
   !1dTRCTRb :=enCFGHI[1]; //load after loading configuration register
   enTRAutoCount=TRCONFIG[12]:
   //first level multiplexer example—16 to 1 multiplexer
   mux(TRACESELLO[3:0], TMUX0[15:0], TMUX1[15:
0], TMUX2[15:0],
   TMUX3[15:0], TMUX4[15:0], TMUX5[15:0], TRACES-
ELHI[15:0],
   TRACESELLO[15:0], TMUX8[15:0], TMUX9[15:0],
TMUXA[15:0],
   TMUXB[15:0], TMUXC[15:0], 0, 0, 0,
   APTRACEDATA[15:0]);
   //second level multiplexer example—5 to 1 multiplexer
   mux(TRACESEL[15:13],   IBTRACEDATA[15:0],
VIDTRACEDATA[15:0],
   MICTRACEDATA[15:0], SPERTNIDATAOUT[15:0],
   APTRACEDATA[15:0],
   TRACEDATAOUT[15:0]); //this output is gated to external pins
```

TRCONFIG[12] is the enable for test mode. It is set or cleared under software control.

There are five multiplexers of 512 inputs each, which inspect five different portions of the ASIC device. There is a nine-bit select signal, TRACESEL[8:0], for the first level multiplexers. A second level five-to-one multiplexer selects the output of one of the five first level multiplexers. The second level multiplexer is selected by TRACESEL[15:13]. The first level multiplexer are selected by the TRACESEL[8:0]. The first level multiplexer select is generated by a counter, that increments by one each clock cycle. When the first level multiplexer select reaches the upper bound (in this case 0×1FF), the second level multiplexer select increments (when incremented from 4, it wraps around to 0).

Thus the present invention advantageously uses circuitry which can change the internal signal sources of one or more output pins of the integrated circuit for functional flexibility. With only a modification of the control logic of the multiplexer system, the present invention creates a test circuit which with a minimum of hardware resources and which can operate concurrently with other test procedures to minimize test time.

Therefore, while the description above provides a full and complete disclosure of the preferred embodiments of the present invention, various modifications, alternate constructions, and equivalents will be obvious to those with skill in the art. Thus, the scope of the present invention is limited solely by the metes and bounds of the appended claims.

What is claimed is:

1. An integrated circuit comprising
   a multiplexer system having at least one output terminal connected to at least one output pin of said integrated circuit and a plurality of input terminals connected to a plurality of internal nodes of said integrated circuit, said multiplexer system selectively connecting one of said plurality of internal nodes to said output pin responsive to control signals defining functionality of said integrated circuit during normal operation; and
   a control circuit generating said control signals to said multiplexer system so that a different internal node is sequentially connected to said at least one output pin responsive to a test clock signal during a test mode of said integrated circuit;
   whereby said multiplexer system carries signals from said selectively connected internal node to said output pin during normal operations and signals from said sequentially connected internal node during said test mode.

2. The integrated circuit of claim 1 wherein said multiplexer system comprises a plurality of output terminals connected to a plurality of output pins, said multiplexer system selectively connecting a subset of said plurality of internal nodes to said plurality of output pins responsive to said control signals, and said control circuit generating said control signals to said multiplexer system so that different subsets of internal nodes are sequentially connected to said plurality of output pins responsive to said test clock signal during said test mode.

3. The integrated circuit of claim 2 wherein different internal nodes are sequentially connected to said plurality of output pins at each cycle of said test clock signal.

4. The integrated circuit of claim 1 wherein said control circuit comprises control logic and a counter connected to said control logic, said counter responsive to each cycle of said test clock signal so that said control logic generates said control signals so that different internal nodes are sequentially connected to said output pin in a cycle at each cycle of said test clock signal during said test mode.

5. The integrated circuit of claim 1 wherein said multiplexer system comprises a plurality of first multiplexers and a second multiplexer, said second multiplexer having said at least one output terminal connected to said at least one output pin and a plurality of input terminals, each input terminal connected to an output terminal of one of said plurality of first multiplexers.

6. The integrated circuit of claim 5 wherein each of said plurality of first multiplexers comprise input terminals, each input terminal connected to one of said internal nodes.

7. The integrated circuit of claim 1 wherein said control circuit generates said control signals to said multiplexer system so that different internal nodes are sequentially connected to said output pin at each cycle of said test clock signal in said test mode.

8. An integrated circuit comprising
   a multiplexer system having at least one output terminal connected to at least one output pin of said integrated circuit and a plurality of input terminals connected to a plurality of internal nodes of said integrated circuit; and
   a control circuit generating control signals to said multiplexer system so that at least one of said plurality of internal nodes is selectively connected to said at least one output pin responsive to said control signals to carry signals from said at least one of selectively connected internal nodes to said output pin in a normal mode and different internal nodes are sequentially connected to said at least one output pin responsive to a test clock signal in a test mode.

9. The integrated circuit of claim 8 wherein said multiplexer system comprises a plurality of output terminals connected directly to a plurality of output pins through a corresponding plurality of input/output buffers, said multiplexer system selectively connecting a subset of said plurality of internal nodes to said plurality of output pins responsive to said control signals, and said control circuit generating said control signals to said multiplexer system so that a selected subset of said plurality of internal nodes are connected to said plurality of output pins in said normal mode and different subsets of said plurality of internal nodes are sequentially connected to said plurality of output pins responsive to said test clock signal in said test mode.

10. The integrated circuit of claim 9 wherein different subsets of said plurality of internal nodes are sequentially connected to said plurality of output pins at each cycle of said test clock signal in said test mode.

11. The integrated circuit of claim 8 wherein said control circuit comprises control logic and a counter connected to said control logic, said counter responsive to each cycle of said test clock signal so that said control logic generates said control signals so that a different internal node is cyclically connected to said output pin at each cycle of said test clock signal.

12. The integrated circuit of claim 8 wherein said multiplexer system comprises a plurality of first multiplexers and a second multiplexer, said second multiplexer having at least one output terminal connected to said at least one output pin and a plurality of input terminals, each input terminal connected to an output terminal of one of said plurality of first multiplexers.

13. The integrated circuit of claim 12 wherein each of said plurality of first multiplexers comprise input terminals, each input terminal connected to one of said plurality of internal nodes.

14. The integrated circuit of claim 8 wherein in said test mode said control circuit generates said control signals to said multiplexer system so that a different at least one internal node is connected to said at least one output pin at each cycle of said test clock signal coincidentally with another procedure for testing said integrated circuit.

15. The integrated circuit of claim 14 wherein said another procedure comprises JTAG.

16. A method of operating an integrated circuit comprising:
   selectively connecting at least one of a plurality of internal nodes of said integrated circuit to at least one output pin of said integrated circuit through a multiplexer system in a normal mode;
   selectively connecting another one of said plurality of internal nodes to said at least one output pin through said multiplexer system in a redefinition of functionality of said integrated circuit during said normal mode; and
   sequentially connecting a different at least one of said plurality of internal nodes of said integrated circuit to said at least one output pin through said multiplexer system responsive to a test clock signal in a test mode.

17. The method of claim 16 wherein a subset of said plurality of internal nodes are connected to a plurality of output pins in said normal mode in said selectively connecting steps and different subsets of said plurality of internal nodes are sequentially connected to said plurality of output pins responsive to said test clock signal in said test mode in said sequentially connecting step.

18. The method of claim 17 wherein different subsets of said plurality of internal nodes are sequentially connected to said plurality of output pins responsive to said test clock signal in said test mode at each cycle of said test clock signal in said sequentially connecting step.

19. The method of claim 16 comprising performing said sequentially connecting step with said multiplexer system, control logic and a counter, said multiplexer system having at least one output terminal connected to said at least one output pin of said integrated circuit and a plurality of input terminals connected to said plurality of internal nodes of said integrated circuit, said counter responsive to each cycle of said test clock signal so that said control logic generates control signals to said multiplexer system so that a different at least one of said plurality of internal nodes is sequentially connected to said output pin at each cycle of said test clock signal.

20. The method of claim 19 wherein said multiplexer system comprises a plurality of first multiplexers and a second multiplexer, said second multiplexer having said at least one output terminal connected to said at least one output pin and a plurality of input terminals, each input terminal connected to an output terminal of one of said plurality of first multiplexers.

21. The method of claim 20 wherein each of said plurality of first multiplexers comprise input terminals, each input terminal connected to one of said plurality of internal nodes.

22. The method of claim 16 wherein performing said sequentially connecting step in said test mode coincidentally with another procedure for testing said integrated circuit.

23. The method of claim 22 wherein said another procedure comprising JTAG.

* * * * *